United States Patent
Hoyer et al.

(10) Patent No.: US 7,961,470 B2
(45) Date of Patent: Jun. 14, 2011

(54) POWER AMPLIFIER

(75) Inventors: Henrik Hoyer, Santa Clara, CA (US);
Donald Fowlkes, Santa Clara, CA (US);
Bradley Griswold, Santa Clara, CA (US)

(73) Assignee: Infineon Technologies AG, Munich (DE)

( * ) Notice: Subject to any disclaimer, the term of this patent is extended or adjusted under 35 U.S.C. 154(b) by 171 days.

(21) Appl. No.: 11/458,548

(22) Filed: Jul. 19, 2006

(65) Prior Publication Data

US 2008/0019108 A1   Jan. 24, 2008

(51) Int. Cl.
*H05K 7/20* (2006.01)

(52) U.S. Cl. ........ 361/709; 361/704; 361/717; 361/719; 361/721; 361/760; 330/67; 330/303; 257/584; 257/666; 257/675; 257/676; 257/684; 257/691; 257/692; 257/712; 257/723; 257/732; 438/15; 438/122; 438/123; 29/827; 29/847

(58) Field of Classification Search ................ 361/709, 361/704, 717, 719, 721, 760; 330/67, 302; 257/584, 666, 675, 676, 684, 691, 692, 712, 257/723, 732; 438/15, 122, 123; 29/827, 29/847

See application file for complete search history.

(56) References Cited

U.S. PATENT DOCUMENTS

| | | | | |
|---|---|---|---|---|
| 4,504,886 A | * | 3/1985 | Cygan et al. | 361/721 |
| 5,012,386 A | | 4/1991 | McShane et al. | |
| 5,297,001 A | * | 3/1994 | Sterling | 361/717 |
| 5,304,512 A | * | 4/1994 | Arai et al. | 29/827 |
| 5,492,842 A | * | 2/1996 | Eytcheson et al. | 438/15 |
| 5,533,257 A | * | 7/1996 | Romero et al. | 29/890.03 |
| 5,539,254 A | * | 7/1996 | Eytcheson et al. | 257/691 |
| 5,663,104 A | * | 9/1997 | Fukuyama | 438/123 |
| 5,763,951 A | * | 6/1998 | Hamilton et al. | 257/714 |
| 5,801,432 A | * | 9/1998 | Rostoker et al. | 257/666 |
| 5,877,555 A | * | 3/1999 | Leighton et al. | 257/732 |
| 5,895,974 A | * | 4/1999 | Eytcheson et al. | 257/723 |
| 5,917,236 A | * | 6/1999 | Leader et al. | 257/670 |
| 6,127,727 A | * | 10/2000 | Eytcheson | 257/692 |
| 6,171,888 B1 | * | 1/2001 | Lynch et al. | 438/123 |
| 6,177,834 B1 | * | 1/2001 | Blair et al. | 327/566 |
| 6,238,454 B1 | * | 5/2001 | Polese et al. | 75/243 |
| 6,278,400 B1 | * | 8/2001 | Cassen et al. | 342/175 |
| 6,295,200 B1 | * | 9/2001 | Schmidt | 361/704 |
| 6,303,974 B1 | * | 10/2001 | Irons et al. | 257/584 |
| 6,351,386 B1 | * | 2/2002 | Fischbach et al. | 361/704 |
| 6,384,474 B1 | * | 5/2002 | Topp | 257/684 |
| 6,414,389 B1 | * | 7/2002 | Hume et al. | 257/732 |
| 6,462,413 B1 | | 10/2002 | Polese et al. | |
| 6,734,728 B1 | * | 5/2004 | Leighton et al. | 330/66 |
| 6,739,047 B2 | * | 5/2004 | Hammond et al. | 29/847 |
| 6,747,300 B2 | * | 6/2004 | Nadd et al. | 257/288 |
| 6,806,106 B2 | * | 10/2004 | Leighton et al. | 438/17 |
| 6,818,477 B2 | * | 11/2004 | Veitschegger et al. | 438/122 |
| 6,847,112 B2 | * | 1/2005 | Ito | 257/712 |
| 6,956,437 B2 | * | 10/2005 | Lopez et al. | 330/296 |
| 7,002,511 B1 | * | 2/2006 | Ammar et al. | 342/134 |
| 7,166,481 B2 | * | 1/2007 | Tellkamp | 438/15 |

(Continued)

FOREIGN PATENT DOCUMENTS

CN    1409873 A    4/2003

*Primary Examiner* — Xiaoliang Chen

(74) *Attorney, Agent, or Firm* — Coats & Bennett, P.L.L.C.

(57) ABSTRACT

An RF power amplifier including a single piece heat sink and an RF power transistor die mounted directly onto the heat sink.

15 Claims, 7 Drawing Sheets

U.S. PATENT DOCUMENTS

| | | | |
|---|---|---|---|
| 7,208,821 B2 * | 4/2007 | Ha et al. | 257/666 |
| 7,215,012 B2 * | 5/2007 | Harnden et al. | 257/676 |
| 7,221,042 B2 * | 5/2007 | Bambridge | 257/666 |
| 7,259,446 B2 * | 8/2007 | Diaz et al. | 257/675 |
| 7,285,849 B2 * | 10/2007 | Cruz et al. | 257/690 |
| 7,291,866 B2 * | 11/2007 | Oshio et al. | 257/99 |
| 7,372,334 B2 * | 5/2008 | Blair et al. | 330/302 |
| 7,405,698 B2 * | 7/2008 | de Rochemont | 343/700 MS |
| 7,605,451 B2 * | 10/2009 | Moline | 257/666 |
| 2003/0183368 A1 * | 10/2003 | Paradis et al. | 165/80.3 |
| 2004/0195662 A1 * | 10/2004 | Venegas et al. | 257/676 |
| 2005/0083118 A1 * | 4/2005 | Bakker | 330/67 |
| 2005/0231925 A1 * | 10/2005 | Fukuda et al. | 361/760 |
| 2007/0047210 A1 * | 3/2007 | Diaz | 361/719 |
| 2007/0172990 A1 * | 7/2007 | Abdo et al. | 438/123 |
| 2007/0296077 A1 * | 12/2007 | Moline | 257/712 |

* cited by examiner

POWER AMPLIFIER

BACKGROUND

RF power amplifiers, under the current state of technology, consist of a power transistor package directly mounted to the main amplifier heat sink as well as connected to the printed circuit board (PCB). FIG. 1 shows a typical basic arrangement 100. Shown are a section of the main amplifier heat sink 110, sections of the amplifier PCB 130a and 130b and the RF power transistor 140. The RF power package also has its own integral heat sink 120. FIG. 2 shows the RF power package 140 minus the lid. The basic package consists of the base heat sink 120 onto which is attached the dielectric insulator frame 150 onto which in turn is attached the input (gate) 170a and output (drain) 170b leads, and both electrical contacts to the power amplifier system. The heat sink 120 acts as the source contact for the transistor device. To complete the device, thinned transistor die 160 plus capacitors are eutectically attached to the heat sink 120. These in turn are wired to each other as well as to the leads 170. Finally a lid is placed onto the package leaving an open cavity transistor device package. This creates a multi-chip module arrangement. FIG. 3 depicts a recess 190 with bolt holes which are often machined into the main heat sink 110 needed to receive the RF power package 140. In the assembly process for the amplifier, the PCB sections 130a and 130b are attached to the main heat sink 110. The RF transistor package 140 is then bolted to the heat sink 110 to make thermal and electrical contact, as shown in FIG. 1. The leads 170a and 170b are, respectively, soldered to the PCB sections 130a and 130b.

The RF power amplifier described above has limitations, especially in regards to the thermal management of the heat generated by the RF power transistor chip 160. The RF power transistor package 140 and its heat sink base 120 are designed to account for the expansion characteristics of the silicon die. This leads to compromises in the thermal conductivity of the package heat sink 120 as well as higher cost. Also the mechanical interface between the package heat sink 120 and the main heat sink 110 can have degraded thermal conductivity if areas of low conductivity or gaps are present in metal-to-metal contact regions. The mounting hardware also increases cost for the amplifier manufacturer. In some cases the package heat sink 120 is soldered directly to the main heat sink 110. This method has reliability concerns due to the expansion characteristics of the heat sinks and the solder, which in turn impacts thermal performance.

SUMMARY

One embodiment of the invention includes an RF power amplifier that has a single piece heat sink. The RF power transistor die is mounted directly onto the heat sink.

BRIEF DESCRIPTION OF THE DRAWINGS

The present invention is better understood by reading the following description of non-limiting embodiments with reference to the attached drawings, which are briefly described as follows.

It is to be noted, however, that the appended drawings illustrate only a few aspects of certain embodiments of this invention and are therefore not limiting of its scope, as the invention encompasses additional or equivalent embodiments.

DETAILED DESCRIPTION

In one embodiment, the RF power amplifier comprise a frame arrangement comprising an insulating dielectric frame and conductive input and output transmission leads attached to the frame, wherein the frame arrangement is fixed on top of the single piece heat sink and enclosing the RF power transistor die. The RF power transistor die may further comprise capacitors electrically coupled with the input and output leads. The RF power amplifier may further comprise a lid placed on top of the frame arrangement. The RF power amplifier may further comprise at least one printed circuit board placed on top of the heat sink for electrical connection with the input and output transmission lines. The heat sink may have a surface shaped to accommodate amplifier design. The surface can be shaped to form a pedestal. The heat sink may in one embodiment have a flat top surface comprising a pedestal with a height that accommodates the printed circuit board. The arrangement also fulfils RF requirements for interconnect wire shape and length. The frame can consist of insulating dielectric material. The frame may consist of ceramic material. A single printed circuit board can be placed on top of the heat sink.

The method for manufacturing an RF power amplifier may further comprise the step of attaching a frame comprising an input and output transmission leads on top of the heat sink. The method may further comprise the steps of placing at least one printed circuit board on top of the heat sink for electrical connection such that the printed circuit board is placed between the transmission lines and a top surface of the heat sink. The method may also comprise the steps of sliding a first and second printed circuit board into an opening created by one of the transmission lines and a top surface of the heat sink, respectively, and electrically connecting the printed circuit boards with the power transistor die. A eutectic bonding process can be used to attach the power transistor die to the heat sink. The heat sink may comprise a pedestal on top of a flat surface. The height of the pedestal can be determined such that a height of an opening created between one of the transmission lines and a flat top surface of the heat sink is approximately equal to the height of the printed circuit board.

Figure 1:
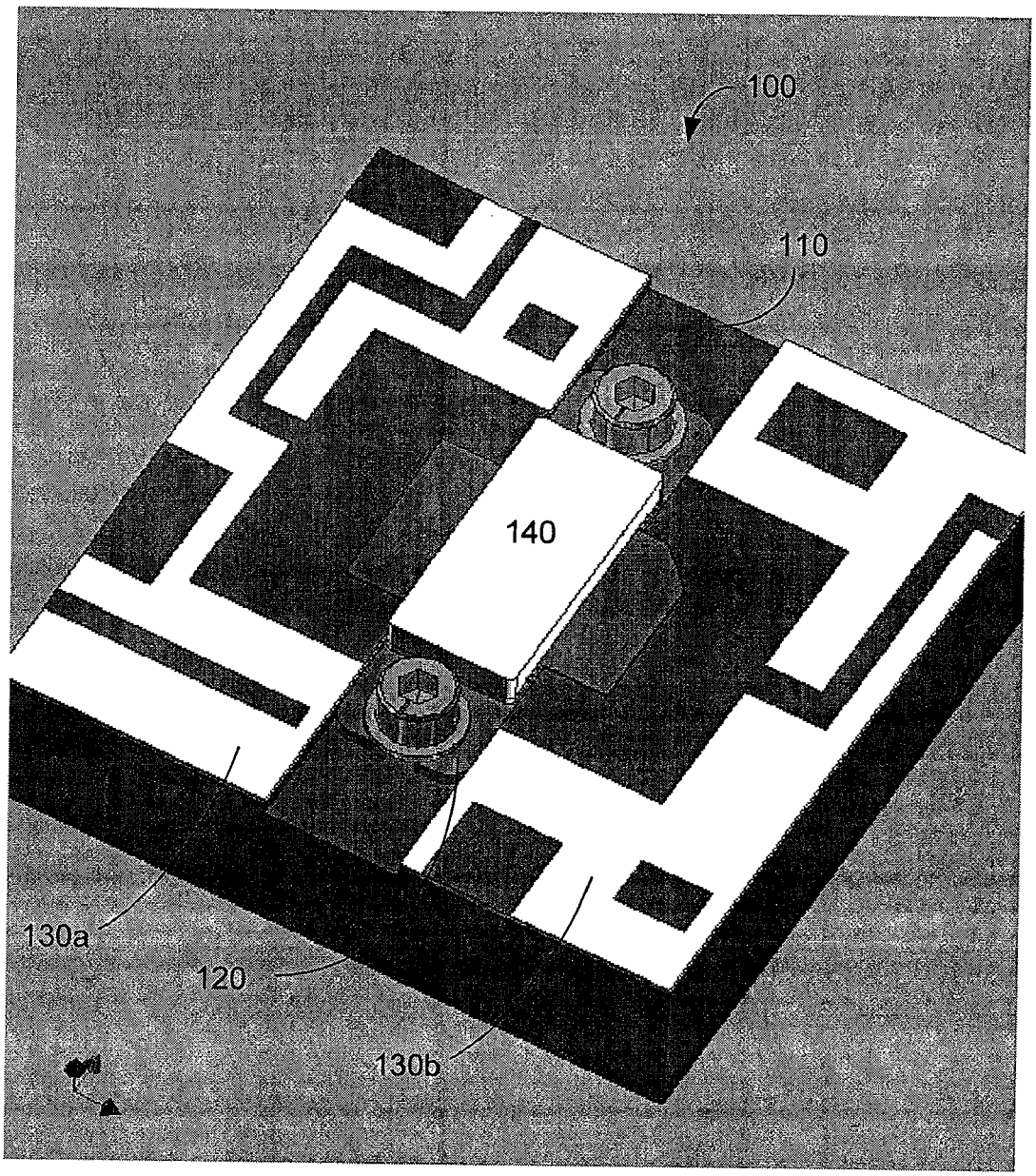
FIG. 1 shows a small section of a conventional RF power amplifier.
Figure 2:
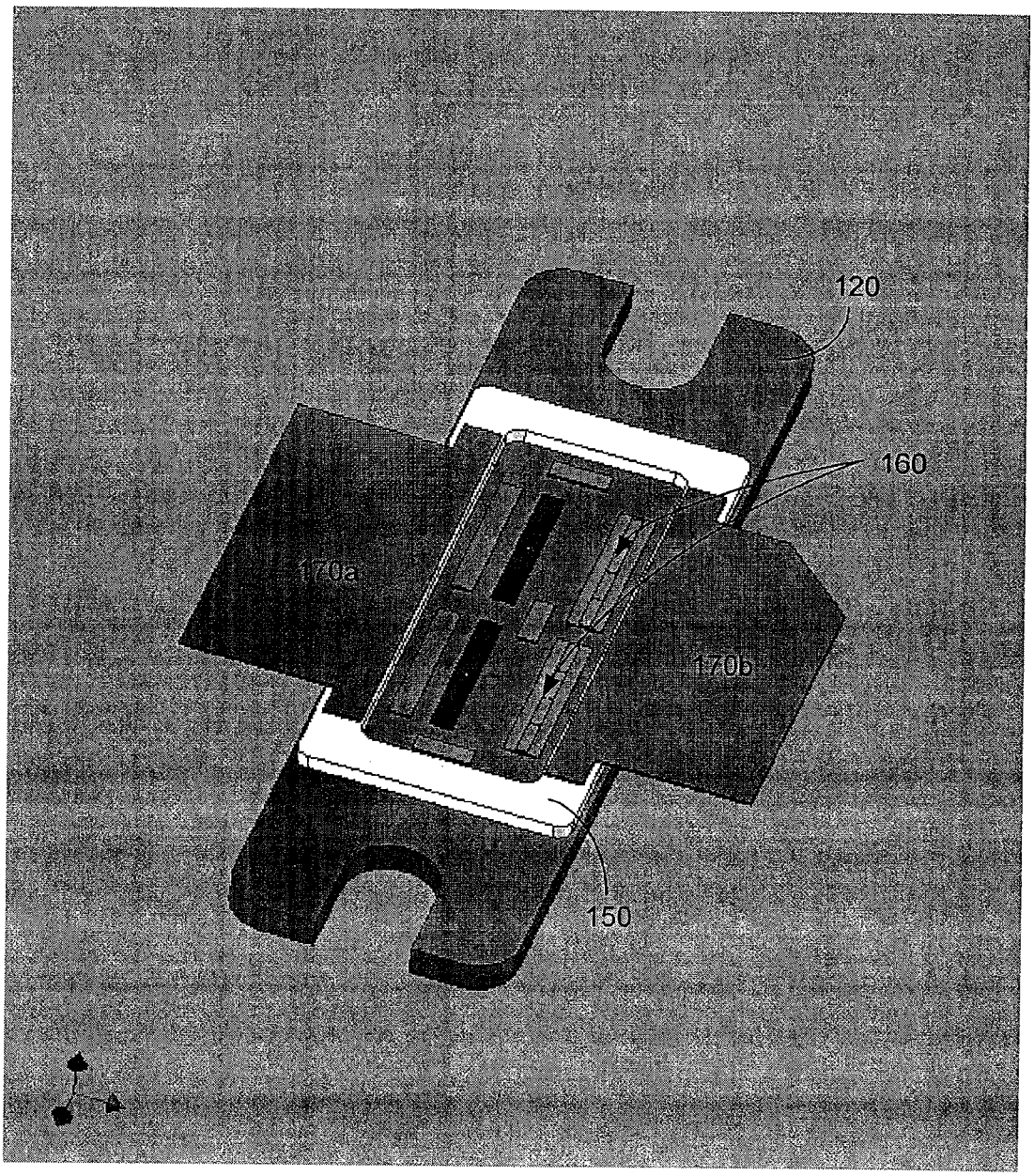
FIG. 2 shows a conventional power transistor package without a lid that includes power transistor die and capacitors.
Figure 3:
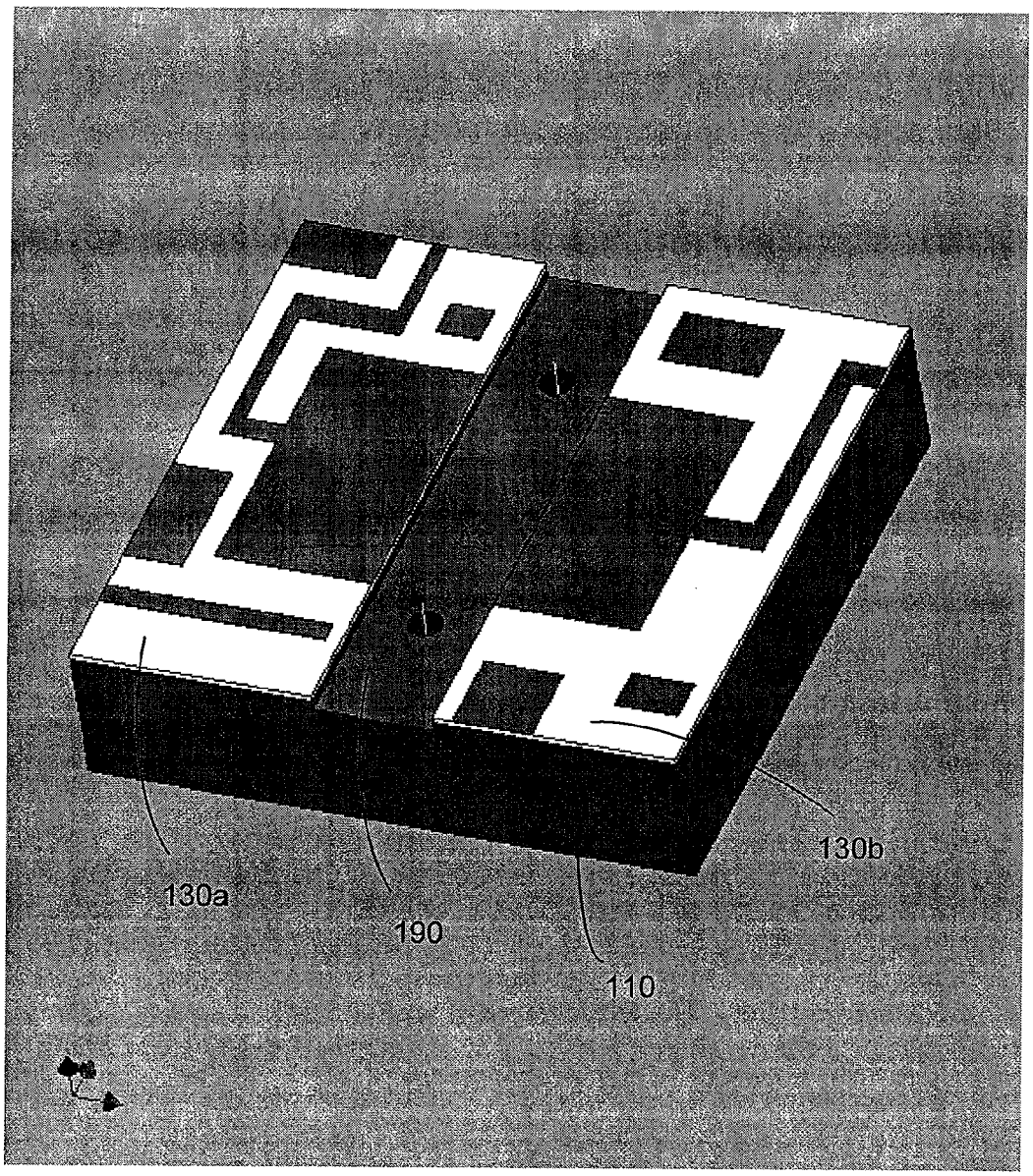
FIG. 3 shows a section of a conventional main heat sink with printed circuit boards for a RF power amplifier.
Figure 4:
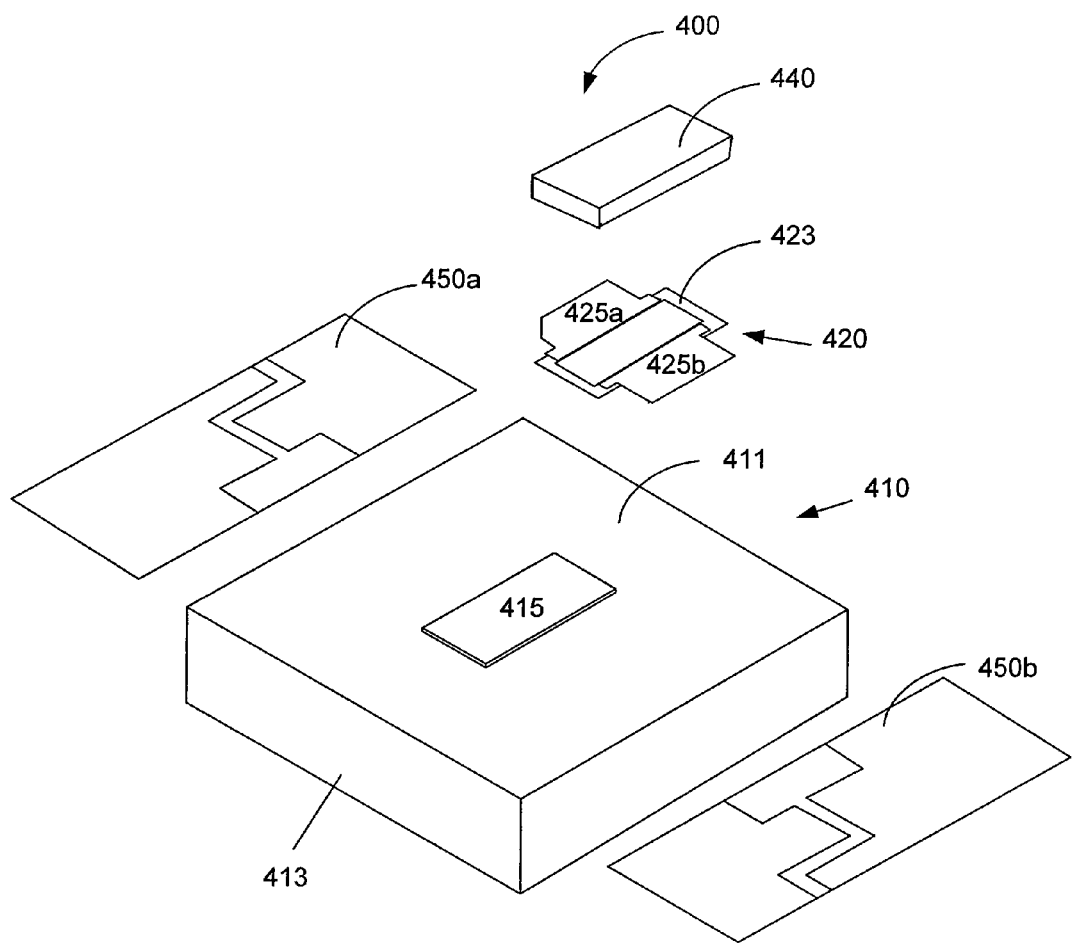
FIG. 4 shows a first exploded view of one embodiment of a power amplifier.

FIG. 4 shows an exploded view of one embodiment of an RF power amplifier. According to this embodiment, one heat sink 410 is used. In one embodiment, the heat sink 410 includes a main body 413 that has a flat top surface 411. In other embodiments, other heat sinks can be used. For example, heat sinks having ribs and different kinds of shapes can be used. In one embodiment, a raised area 415 is located at the center of the top surface 411. In one embodiment, the raised area 415 is a pedestal 415.

In one embodiment, an integrated pedestal 415 is located at the center of the top surface 411. In other embodiments, pedestal 415 can be located in other suitable area on top surface 411. In the illustrated embodiment, pedestal 415 has rectangular shape. However, in other embodiments, pedestal 415 can have other suitable shapes to accommodate various transistor die as will be explained in more detail below. Pedestal 415 includes vertical dimensions that accommodate PCB 450 and allows the capability to adjust the wire length and height for connections to the leads 425 for RF tuning purposes. In various embodiments, heat sink 410 can be made from any suitable type of thermally and electrically conductive material, such as aluminum.

FIG. 4 furthermore shows one embodiment of a frame arrangement 420 that includes a frame 423 and terminals or leads 425a and 425b. In various embodiments, leads 425 can be made from suitable materials such as copper. The frame 423 can include ceramic or other electrically insulating or dielectric materials that can accommodate RF power transistor electrical requirements. In various embodiments, the frame arrangement 420 can come as a single assembly or be assembled after attachment of frame 423 to pedestal 415. FIG. 4 also shows printed circuit boards (PCBs) 450a and 450b which provide for connection to the transistor package via leads 425a and 425b. In one embodiment, a single PCB 450 for connection to the transistor package can be used. In one embodiment, a single PCB can be attached to the heat sink before a transistor die is placed on the heat sink.

Figure 5:
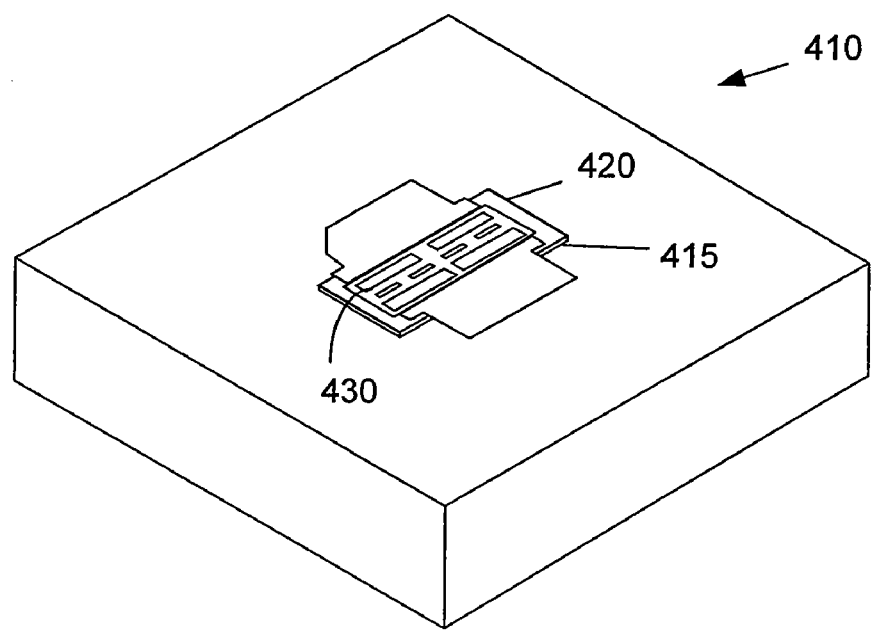
FIG. 5 shows one embodiment of a die, capacitors, a frame and leads assembled onto a heat sink.

FIG. 5 shows one embodiment wherein a transistor die array 430, a capacitor array 432 and the frame arrangement 420 are placed on pedestal 415. In other embodiments, capacitor array 432 is not used. In various embodiments, the transistor die array 430 can be attached to the pedestal by using a high temperature soldering process or by using a gluing process that provides for a thermal and electrical connection of the die array 430 to the heat sink 410. In one embodiment, a silicon-gold eutectic bonding process can be used to mount the transistor die array 430 onto pedestal 415. In another embodiment, a thermally and electrically conductive epoxy glue can be used. In various embodiments, transistor die array 430 can include other devices such as capacitors and bond wires that create respective input and output matching networks. In the illustrated embodiment, after transistor die array 430, a capacitor array 432 and the frame arrangement 420 are placed on pedestal 415, bond wires are used to interconnect as necessary the transistor die array 430, that capacitor array 432 and that leads 425a and 425b.

Figure 6:
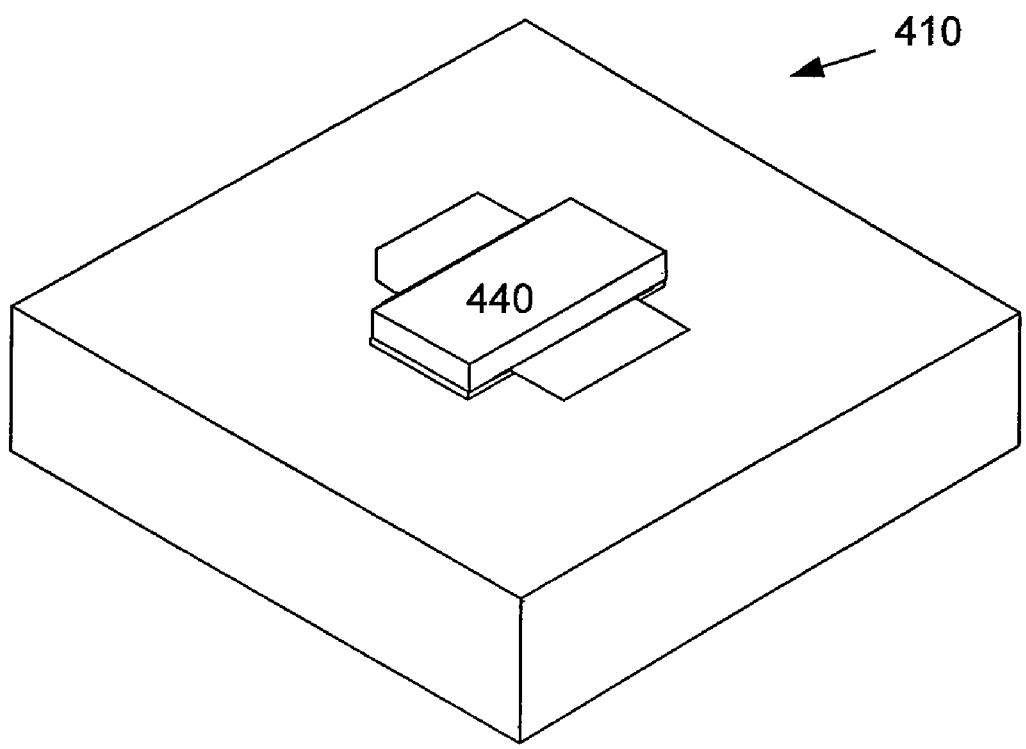
FIG. 6 shows one embodiment of a protective lid mounted over a frame.

FIG. 6 illustrates one embodiment of a protective lid 440 mounted over a frame arrangement 420. Lid 440 is placed over the frame arrangement 420 to protect the transistor die array 430 and capacitor array 432. In various embodiments, lid 440 can be made from materials such as ceramic or other suitable materials. In some embodiments, lid 440 can include recesses to accommodate the transmission lines or leads 425a and 425b. The lid 440 can be attached using any appropriate attachment method or material such as an adhesive. In various embodiments, lid 440 can be attached at any step after the wire bond process.

Figure 7:
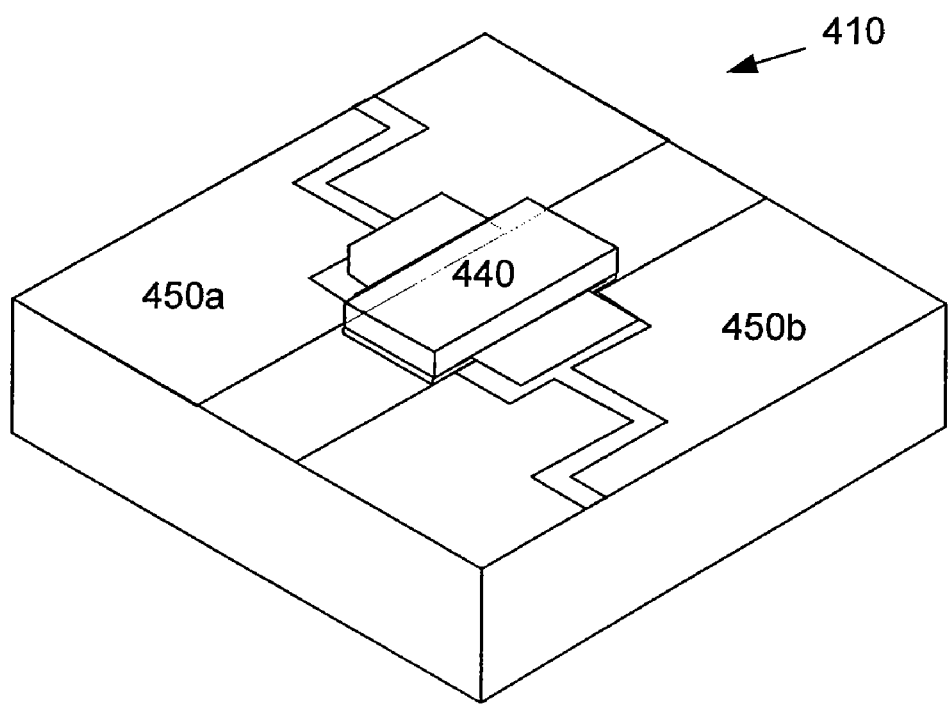
FIG. 7 shows one embodiment of a final assembly that includes printed circuit boards mounted to a heat sink.

FIG. 7 shows one embodiment of printed circuit boards 450a and 450b mounted to heat sink 410. In one embodiment, heat sink 410 has a flat top surface that includes a pedestal 415 that has a height that accommodates the printed circuit boards 450a and 450b and that provides for the fulfillment of RF requirements for the shape and length of interconnect wires. In one embodiment, the printed circuit boards 450a and 450b are slid into an opening formed between the heat sink 410 and the transmission lines 425a and 425b after the frame is placed on pedestal 415. To this end, in this embodiment, the height of pedestal 415 is designed such that the opening created between either or both of the transmission lines 425a and 425b and the heat sink 410 is approximately the same as the height of the printed circuit boards 450a or 450b. In one embodiment, the pedestal 415 has a height that accommodates one or more electrical connections between the input and output leads 450a and 450b and the at least one printed circuit board.

In various embodiments, the printed circuit boards 450a and 450b can be placed at different times during the manufacturing process on top of the heat sink 410. In one embodiment, leads or bond wires are attached before the PCB 450 is placed on heat sink 410. In one embodiment, leads or bond wires are attached after the PCB 450 is placed on heat sink 410. In various embodiments, the printed circuit boards 450a and 450b can be soldered onto heat sink 410, by using a process such as a reflow process. Any suitable number of printed circuit boards 450 can be used in other embodiments. In one embodiment, a single PCB 450 can be used to provide connection to the power transistor package. In various embodiments, any suitable attachment methods or materials such as adhesives can be used.

Therefore, the present invention is well adapted to carry out the objects and attain the ends and advantages mentioned as well as those that are inherent therein. While changes may be made by those skilled in the art, such changes are encompassed within the spirit of this invention as defined by the appended claims.

What is claimed is:

1. A power amplifier, comprising:
   a single piece heat sink including a raised pedestal having an attachment surface;
   a frame arrangement attached to an outer region of the attachment surface of the raised pedestal;
   a power transistor die directly attached to an inner region of the attachment surface of the raised pedestal, the inner region being spaced inward from the outer region;
   an electrically conductive lead mounted on a top side of the frame arrangement and extending laterally outward from the frame arrangement away from the raised pedestal so that a gap is formed between the heat sink and a bottom side of the lead;
   a printed circuit board attached to the heat sink and at least partly disposed in the gap between the lead and the heat sink; and
   an electrical connection between the printed circuit board and the power transistor die via the lead.

2. The power amplifier of claim 1, wherein the frame arrangement includes a dielectric frame and conductive input and output transmission leads attached to the dielectric frame.

3. The power amplifier of claim 1, wherein the power transistor die is enclosed by the frame arrangement on the raised pedestal.

4. The power amplifier of claim 2, wherein the frame arrangement is sized to accommodate the raised pedestal.

5. The power amplifier of claim 4, wherein the raised pedestal has a height that accommodates one or more electrical connections between the input and output leads and the printed circuit board.

6. The power amplifier of claim 5, wherein an opening between the input or output leads and the heat sink is approximately the same as a height of the printed circuit board.

7. The power amplifier of claim 2, comprising one or more capacitors that are attached to the heat sink and that are electrically coupled to the input or output leads.

8. An RF power amplifier, comprising:

a single piece heat sink including a raised pedestal;

a frame arrangement attached to the raised pedestal;

an RF power transistor die directly attached to the raised pedestal so that the frame arrangement encloses the RF power transistor die on the raised pedestal;

an electrically conductive lead mounted on a top side of the frame arrangement and extending laterally outward from the frame arrangement away from the raised pedestal so that a gap is formed between the heat sink and a bottom side of the lead;

a printed circuit board attached to the heat sink and at least partly disposed in the gap between the lead and the heat sink; and an electrical connection between the printed circuit board and the power transistor die via the lead.

9. The RF power amplifier of claim 8, wherein the frame arrangement includes a dielectric frame and conductive input and output transmission leads attached to the dielectric frame.

10. The RF power amplifier of claim 9, comprising a lid placed on top of the frame arrangement.

11. The RF power amplifier of claim 9, wherein the printed circuit board is configured to electrically connect with the input and output transmission leads.

12. The RF power amplifier of claim 11, wherein an opening between the input or output transmission leads and the heat sink is approximately the same as a height of the printed circuit board.

13. The RF power amplifier of claim 12, wherein the dielectric frame comprises a ceramic material.

14. A power amplifier, comprising:

a single piece heat sink including a raised pedestal;

a frame arrangement that includes input or output leads mounted on a top side of the frame arrangement and which extend laterally outward from the frame arrangement away from the raised pedestal so that a gap is formed between the heat sink and a bottom side of each lead, the frame arrangement attached to the raised pedestal;

a power transistor die directly attached to the raised pedestal so that the power transistor die is thermally and electrically connected to the heat sink and the frame arrangement encloses the power transistor die on the raised pedestal;

a printed circuit board attached to the heat sink and at least partly disposed in the gap; and one or more electrical connections between the printed circuit board and the input or output leads.

15. A system comprising:

a printed circuit board;

a single piece heat sink attached to the printed circuit board, the single piece heat sink including a raised pedestal;

a frame arrangement attached to the raised pedestal;

an electrically conductive lead mounted on a top side of the frame arrangement and extending laterally outward from the frame arrangement away from the raised pedestal so that a gap is formed between the heat sink and a bottom side of the lead, the printed circuit board being at least partly disposed in the gap; and a transistor die directly attached to the raised pedestal such that the frame arrangement encloses the transistor die on the raised pedestal.

* * * * *